(12) United States Patent
Gately et al.

(10) Patent No.: US 6,541,712 B1
(45) Date of Patent: Apr. 1, 2003

(54) HIGH SPEED MULTI-LAYER PRINTED CIRCUIT BOARD VIA

(75) Inventors: Ellen M. Gately, Merrimack, NH (US); Robert A. McGrath, Londonderry, NH (US); Mark W. Gailus, Somerville, MA (US)

(73) Assignee: Teradyhe, Inc., Boston, MA (US)

( * ) Notice: Subject to any disclaimer, the term of this patent is extended or adjusted under 35 U.S.C. 154(b) by 0 days.

(21) Appl. No.: 10/007,689

(22) Filed: Dec. 4, 2001

(51) Int. Cl.⁷ .................................................. H01R 9/09
(52) U.S. Cl. ........................ 174/266; 174/262; 174/258; 257/698; 361/795
(58) Field of Search ................................ 174/262, 266, 174/258; 361/792, 795; 257/698

(56) References Cited

U.S. PATENT DOCUMENTS

| | | | |
|---|---|---|---|
| 4,686,607 A | 8/1987 | Johnson | 361/413 |
| 5,495,665 A * | 3/1996 | Carpenter et al. | 29/830 |
| 6,372,999 B1 * | 4/2002 | Bjorndahl et al. | 174/262 |
| 6,428,942 B1 * | 8/2002 | Jiang et al. | 430/312 |

* cited by examiner

Primary Examiner—Cathy Lam
(74) Attorney, Agent, or Firm—Daly, Crowley & Mofford, LLP

(57) ABSTRACT

A multi-layer printed circuit board includes a via having a conductive upper portion, a conductive lower portion, and an electrically insulating intermediate portion between the upper and lower portions. In one embodiment, the insulating intermediate portion of the via is provided by a non-platable layer of the circuit board, as may be comprised of PTFE. Vias having a continuous conductive coating may be formed through clearance holes in the non-platable layer which are provided with a platable inner surface, either by filling the hole with a platable material, such as epoxy resin, prior to laminating the board or by chemically conditioning the non-platable material to make it platable. In a further embodiment, the as insulating intermediate portion of the via has a narrower diameter than the conductive upper and lower portions.

12 Claims, 7 Drawing Sheets

HIGH SPEED MULTI-LAYER PRINTED CIRCUIT BOARD VIA

CROSS-REFERENCE TO RELATED APPLICATIONS

Not applicable.

STATEMENTS REGARDING FEDERALLY SPONSORED RESEARCH

Not applicable.

FIELD OF THE INVENTION

This invention relates generally to printed circuit boards and, more particularly, to multi-layer printed circuit boards which carry high speed signals.

BACKGROUND OF THE INVENTION

As is known in the art, conductive traces are formed on printed circuit boards for carrying data and power signals between components mounted on the board. Space considerations often require the use of multi-layer printed circuit boards including multiple layered dielectric substrates with conductive traces formed on each substrate.

In a conventional printed circuit board manufacturing process, the printed circuit board is assembled using "laminate." Laminate is a thin sheet of a matrix material, usually epoxy, that is reinforced by fiberglass. A copper cladding is adhered to each side of the epoxy sheet. The epoxy is cured to hold the laminate together. The copper cladding is etched to make the circuit traces on each side of the laminate.

Several sheets of laminate are stacked up with dielectric spacers (sometimes called "prepreg") in between. The dielectric spacers provide the required separation between circuit traces on the opposing faces of adjacent laminates. The spacers also secure the laminates into a finished printed circuit board. The spacers are usually made of a partially cured resin. The stack of laminates and spacers are pressed together, usually in a heated oven, to force the resin from the spacers to adhere to the laminates and cure the entire stack into a rigid printed circuit board.

In order to interconnect conductive traces on different layers, conductive vias extend between layers of the multi-layer printed circuit board. For this purpose, conductive vias intersect vertically aligned pads joined to conductive traces on different layers. Conductive vias also interconnect components mounted on the board to conductive traces on inner layers of the board. More particularly, a contact of the component, such as a press-fit pin, makes contact with the conductive walls of the via and the conductive walls of the via, in turn, contact one or more pads of conductive traces on inner layers of the board. Vias which extend through all layers of a multi-layer board are sometimes referred to as through holes.

Conductive vias are formed after the layered substrates are formed into a board by drilling holes through at least a portion of the board and plating the walls of the holes with a conductive material, such as copper. Typically, a thin layer of copper is applied by an electroless process. An electrical potential is connected to this thin layer of copper and a thicker layer of copper is deposited over the thin layer by an electrolytic deposition process. In order to ensure reliable plating of the via walls, the aspect ratio of the printed circuit board thickness to the via diameter is typically below 14:1. For example, for a circuit board having a thickness on the order of 0.300" (7 mm), the via diameter must be at least 0.22" (0.5 mm). This minimum via diameter limits the number of vias that can be provided in a given circuit board area.

An illustrative multi-layer printed circuit board 10 having a conductive via 14 is shown in FIG. 1 to include dielectric layers 12a, 12b, and 12c, with conductive traces 16,18 formed on layers 12b, 12c, respectively. In the example, a four layer board is shown. It should be appreciated that the number of layers is selected for simplicity of illustration and the number of layers is not a limitation on the invention. However, the invention will be most useful with thicker boards or boards carrying high frequency signals. The signal integrity of boards carrying signals in excess of 2.5 GHz will be most improved by the invention. The conductive via 14 extends through a pad 17 of signal trace 16 and a pad 19 of signal trace 18 in order to electrically interconnect the signal traces 16 and 18. Also, a pin 26 of a component 28 inserted at least partially into the via 14 contacts the conductive walls of the via and thus, is electrically connected to signal traces 16, 18.

The high data rates of signals carried by printed circuit boards require careful attention to aspects of the circuit board structure affecting signal quality. As one example, portions of a via extending beyond inner layers of the board which are interconnected to other layers and/or to a component mounted on the board, such as portion 20 of via 14, can act as a resonant stub, causing undesirable signal reflections at certain frequencies.

One solution to this problem is to use "blind" or buried vias for interconnecting traces on inner layers of a printed circuit board. A blind via extends from a surface of a board through only a portion of the layers of a multi-layer printed circuit board. It is, however, undesirable to make blind vias of multiple depths. Buried vias are used to interconnect two interior layers of the printed circuit board. Buried vias are formed by first making a subassembly from several layers of the printed circuit board. A hole is drilled through these layers and the hole is plated. Additional substrate layers are added to the top and the bottom of the subassembly to make a completed printed circuit board. The resulting buried vias are inaccessible and increase the manufacturing complexity of the multi-layer printed circuit board.

An alternative technique for eliminating resonant stubs in conductive vias is to remove the stub portions of the via by drilling them out of the board. For example, by drilling a hole through layer 12c concentrically around, and with a larger diameter than the via 14, the via portion 20 extending through layer 12c is removed. However, this technique requires additional is manufacturing steps.

SUMMARY OF THE INVENTION

It is an object of the invention to eliminate or at least decrease the length of resonant stub portions of conductive vias in a multi-layer printed circuit board.

This and other objects of the invention are achieved by providing, in a preferred embodiment of a multi-layer printed circuit board, a via having an upper electrically conductive portion, a lower electrically conductive portion, and an intermediate, electrically insulating portion between the upper and lower portions. The electrically insulating portion provides a discontinuity in the conductive coating of the via. Thus, the via may be referred to as a "discontinuous via." Both the upper and lower conductive portions of the via can be used to interconnect conductive traces on layers which are on the same side of the electrically insulating portion of the via and to interconnect components mounted on the board to conductive traces on inner layers of the board.

With this arrangement, portions of the via extending beyond the layers of the board which are interconnected by the via, which would otherwise form a resonant stub, are either shortened or eliminated. A further advantage of the discontinuous via is that two pins, from two different components, can be inserted into a single via, one into the upper conductive portion and one into the lower conductive portion. In this way, the circuit board density is increased.

The discontinuous via can be formed in various structures and by various fabrication techniques. In one embodiment, one or more entire layers of a multi-layer circuit board are comprised of a non-platable material and the intermediate insulating portion of the via extends through the non-platable layer. The material is "non-platable" in the sense that a conductive coating applied to the via by an electroless plating process does not adhere to the material. One suitable non-platable material is a fluoropolymer resin, such as TEFLON® polytetrafluoroethylene (PTFE). In locations of the circuit board where it is desired to provide a conventional via with a continuously conductive coating through the board (i.e., a "continuous via"), clearance holes formed in the non-platable layer are provided with a platable inner surface to form a platable "plug", either by filling the hole with a platable material, such as epoxy resin, prior to drilling and plating the continuous via or by chemically conditioning the non-platable material to make it platable.

In an alternative embodiment, only portions of one or more of the circuit board layers are comprised of a non-platable material. For example, in a location where it is desired to provide a discontinuous via, a clearance hole is formed in a conventional dielectric circuit board layer and is filled with PTFE to form a "non-platable plug." The discontinuous via is formed by drilling a hole through the board, including through the non-platable plug, and plating the drilled hole. Since the plating does not adhere to the non-platable plug, a discontinuity in the via coating is provided. Alternatively, a layer which has only portions of non-platable material can formed by punching holes in a sheet of non-platable material and filling the voids with platable material.

According to a further embodiment, a discontinuous via is formed by drilling, through a multi-layer circuit board, a hole having a first portion of a first diameter, a second portion of a second diameter, and an intermediate portion between the first and second portions and having a third diameter smaller than the first and second diameters. This multi-diameter hole is formed by drilling a relatively small diameter hole through the board, drilling partially through the board from a first surface concentrically around the small diameter hole, and drilling partially through the board from the second, opposite surface concentrically around the small diameter hole. The hole is then plated and is further drilled with a drill bit having a diameter greater than the first diameter and less than the second and third diameters. This last drilling step removes the plating on the narrow diameter, intermediate portion of the via to provide a discontinuity in the via coating.

BRIEF DESCRIPTION OF THE DRAWINGS

The foregoing features of this invention, as well as the invention itself, may be more fully understood from the following description of the drawings in which.

DESCRIPTION OF THE PREFERRED EMBODIMENT

Figure 2:
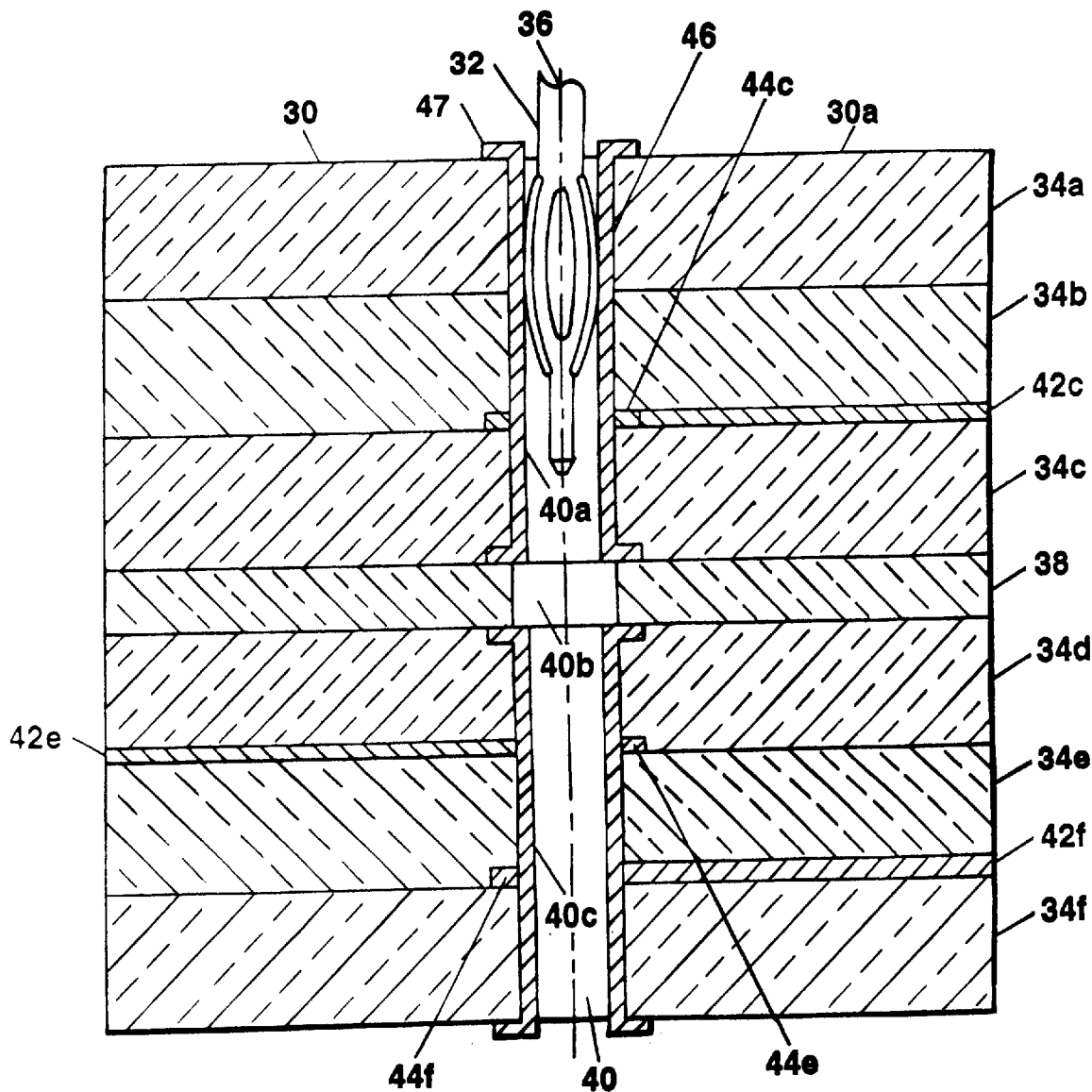
FIG. 2 is a cross-sectional view of a multi-layer printed circuit board having a non-platable layer and a discontinuous via according to the invention.

Referring to FIG. 2, a multi-layer printed circuit board 30 includes a plurality of stacked dielectric layers, including conventional dielectric layers 34a, 34b, 34c, 34d, and 34e, 34f and a non-platable dielectric layer 38. The non-platable layer 38 is comprised of a material to which a conductive coating applied by an electroless plating process does not adhere.

A via 40 extends through the multi-layer circuit board 30 and has an upper portion 40a which is plated with a conductive material, a lower portion 40c which is plated with a conductive material, and an intermediate portion 40b between the upper and lower portions which is not plated and is electrically insulating. The intermediate via portion 40b extends through the non-platable layer 38. The terms "upper" and "lower" are used in connection with via portions 40a, 40c, respectively, for illustration purposes and do not require a particular orientation of the board.

The intermediate portion 40b of the via 40 provides a break, or discontinuity in the conductive coating of the via. Thus, the via 40 may be referred to as a "discontinuous via." Each of the conductive via portions 40a, 40c can be used to interconnect circuit board layers which are not separated by the intermediate via portion 40b (i.e., layers located on the same side of the intermediate via portion 40b). For example, via portion 40c intersects a pad 44e of a conductive trace 42e formed on layer 34e and also intersects a vertically aligned pad 44f of a conductive trace 42f formed on layer 34f, thereby interconnecting conductive traces 42e and 42f, as shown.

The conductive via portions 40a, 40c may also be used to interconnect a component, such as a connector or integrated circuit, mounted on the board 30 to one or more conductive traces on inner layers of the board which are on the same side of the non-platable layer 38 as the respective via portion 40a, 40c. For example, upper via portion 40a interconnects a component 36 mounted on surface 30a of the board to a trace 42c on inner layer 34c. More particularly, a contact or pin 32 of the component 36 is inserted into the via portion 40a and makes contact with the conductive walls of the via which are further in contact with the conductive trace 42c. In the illustrative embodiment, the pin 32 is press-fit into the via portion 40a, but may alternatively be soldered to a conductive pad 47 formed on the surface 30a of the board in contact with the conductive coating of the via portion.

With this arrangement, portions of the via 40 extending beyond inner layers of the board which are interconnected to other layers and/or to a component mounted on the board, which would otherwise form a resonant stub, are either shortened or eliminated. A further advantage of the discontinuous via 40 is that two pins, from two different components, can be inserted into the single via 40, one into the upper conductive portion 40a and one into the lower conductive portion 40c, thereby increasing the circuit board density.

In a preferred embodiment, the non-platable dielectric layer 38 is comprised of a fluoropolymer resin, such as TEFLON® polytetrafluoroethylene (PTFE), as is commercially available from E.I. du Pont de Nemours and Company. Preferably, the non-platable material is in the form of a conventional laminate used in the manufacture of printed circuit boards. TEFLON® PTFE has a high density of intermolecular bonds that makes it relatively smooth and chemically non-reactive and prevents the electroless copper plating from adhering. It is a suitable material for the non-platable layer. It will be appreciated by those of ordinary skill in the art however, that other materials to which conductive plating does not adhere or at least does not adhere well may be suitable, such as polyethylene and other polymers. More generally, suitable materials for the non-platable layer are "non-reactive" materials, such as those having a stable electron configuration in the outer shell with no free radicals to form ionic or covalent bonds. It will also be appreciated that the layer 38 may be comprised of a combination of PTFE and other materials, particularly epoxy or other suitable binder. As one example, the layer 38 may be comprised of PTFE reinforced with glass or ceramic fibers, as may be desirable to prevent movement of the layer after the board 30 is laminated.

Suitable non-platable materials might be procured commercially. Rogers 6000 Series copper clad laminates or Nelco 6000 Series copper clad laminates could be used. The copper cladding on these laminates can be patterned using photolithography and chemical etching as for conventional processing of fiberglass epoxy laminates. However, when such non-platable materials are used for making conventional printed circuit boards, they are chemically treated to make the material platable, allowing the copper to stick to them during the electroless plating process. This chemical treatment step will preferably be omitted for any hole in which it is desired to create a discontinuous via.

The thickness of the non-platable layer 38 can be varied. Illustrative thicknesses are on the order of approximately 5–50 mils (0.1 to 1 mm), with 30 mils (0.7 mm) being typical. Preferably, the thickness will be greater than 5 mils (0.1 mm) to ensure sufficient spacing between the conducting portions of the discontinuous via. Often, the thickness will be determined by the desired electrical properties of the traces formed on the layer. The layer 38 can have the same thickness as the other layers 34a–34f of the board, or a different thickness.

In the preferred embodiment, each of the dielectric layers 34a–34f is comprised of a conventional printed circuit board material, such as a fiberglass-reinforced epoxy resin, and has a typical thickness between 0.005" (0.1 mm) and 0.05" (1 mm). Other suitable materials contain polyimide resins or GETEC, supplied by General Electric.

As in the manufacture of a conventional printed circuit board, the board is formed by stacking up cured laminates interspersed with partially cured spacers (sometimes called "prepreg"). The stack is then pressed, causing the materially of the partially cured spacers to adhere to the laminates. Where copper clad laminates are used to form the PTFE layers, the partially cured spacers can be adhered directly to the copper cladding. If the non-platable laminates are not copper clad or so much of the copper has been removed that a suitable mechanical bond cannot be formed, the exposed non-platable material can be activated to form a sufficient bond to the partially cured spacer. The materials of the preferred embodiment are selected because such processing steps are known in the art. In the case of epoxy prepreg and PTFE laminate, the PTFE can be activated by a plasma etch.

The material of the dielectric layers 34a–34f may be considered "platable" in the sense that a conductive material applied by an electroless plating process adheres to the platable material. The conductive traces 42 and pads 44 are comprised of a conventional material, such as copper, and are formed in a desired pattern using conventional photolithographic techniques.

The layers 34a–34f and the non-platable layer 38 are stacked and pressed together at elevated temperatures (i.e., laminated). It will be appreciated by those of ordinary skill in the art that the non-platable layer 38 may be positioned between any of the layers 34a–34f, depending on the desired location for a discontinuity in the via coating. Also, it will be appreciated that more than one non-platable layer 38 may be interleaved with the platable dielectric layers 34a–34f in applications in which it is desirable to form discontinuous vias having three or more conductive portions spaced by two or more insulating portions.

Once the circuit board 30 is laminated, the via 40 is formed by drilling a hole 46 through the board and plating the hole. In the illustrative embodiment, the hole 46 has a diameter on the order of 0.016" (0.4 mm) to 0.045" (1.1 mm). It is generally desirable to remove any epoxy resin from the layers 34a–34f that may be spread along the walls of the hole 46 during drilling. The epoxy resin is removed from the walls of the holes. A known cleaning process may be used, such as a chemical reduction process using potassium permanganate.

In the illustrative embodiment, a two-step plating process is used, including a first, electroless deposition of a thin layer of copper, followed by a second, electrolytic deposition of a thicker layer of copper. The electroless application of copper is done using a known process. A typical process involves surface activation using a palladium activator followed by chemical reduction of copper from solution. In a typical process, the copper plating is deposited at a thickness between 0.00002" (0.4 micrometers) and 0.00008" (2 micrometers). Preferably, the electroless coating will have a thickness of 0.2 micrometers to 2.5 micrometers.

As described above, the electroless plating should not adhere to the non-platable layer. It has been observed that copper tends to adhere to the ends of the fiber ends during electroless plating. Thus, in the presently preferred embodiment, there are no glass fibers in the non-platable layer. Where fiber reinforcement is desired, it has been found that ceramic fiber is less susceptible to plating than glass fiber. But, where fiber reinforcement is desired, the small amount of electroless plating material on the non-platable layer caused by the exposed fiber ends can be removed before electrolytic plating. Where electroless plating has partially adhered to the non-platable layer, it can be removed by conventional board cleaning steps, such as high-pressure spray or ultrasonic cleaning. Thus, an optional cleaning step might be performed between electroless and electrolytic depositions to remove any plating loosely adhering to the non-platable layers.

The electroless copper serves as a "seed" for the electrolytic deposition. The electroless copper is connected to an electrical potential with the board in a bath of a solution containing copper. The electrical potential draws the copper out of the solution to the areas of the board to which the electroless coating has adhered. The layer of copper provided by the electrolytic deposition has a thickness on the order of 0.001" (0.025 mm) to 0.002" (0.05 mm). For electroless coatings at the thinner end of the range, electrolytic deposition is sometimes done in multiple steps, with a first "flash" coating applied quickly after the electroless deposition to protect the coating.

The plated board can then be finished according to a conventional process. The surface of the board is coated with copper. This copper can be patterned using traditional photolithographic methods. In one such process, a photosensitive coating is applied to the surfaces of the board. The mask is selectively exposed to light and removed in areas where copper traces are desired. A solder coating is applied to all exposed surfaces, including inside the via holes. The solder adheres to the exposed copper, but not to the areas covered by the photoresist mask. Accordingly, the solder does not adhere to the non-platable layers. The remaining mask is then removed and the exposed copper is etched. Copper protected by the solder remains. The solder can be removed or can be retained, depending on the application of the printed circuit board.

The finished board resembles a conventional printed circuit board. Significantly, the copper applied during the electroless and electrolytic depositions does not adhere to the non-platable layer 38, leaving a discontinuous via.

Figure 1:
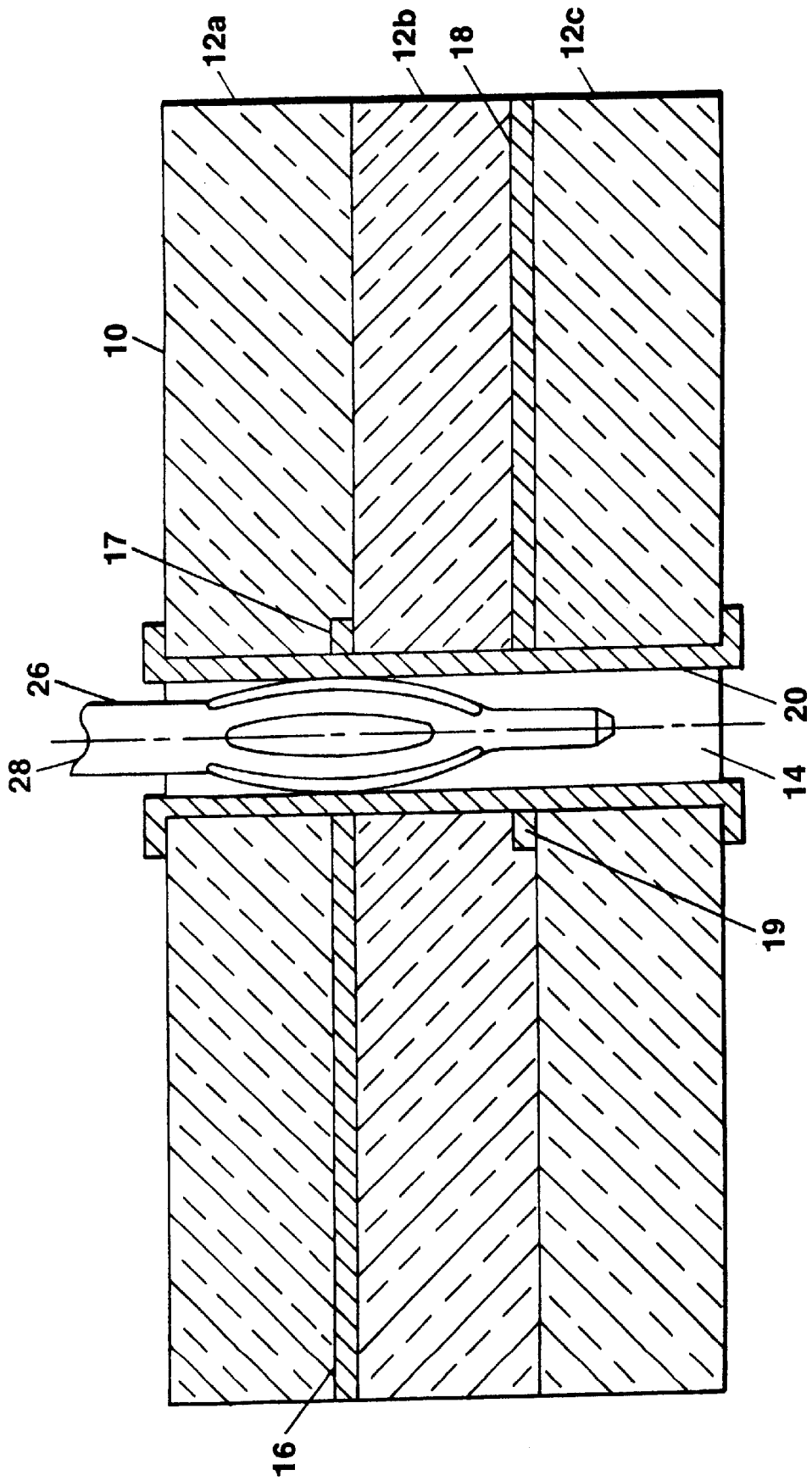
FIG. 1 is a cross-sectional view of a multi-layer printed circuit board having a conventional continuous via.

In some applications, it may be desirable to provide discontinuous vias, like via 40 of FIG. 2, and continuous vias, like via 14 of FIG. 1, in the same multi-layer printed circuit board. This can be achieved in a multi-layer circuit board having a non-platable layer by forming platable portions in the non-platable layer prior to laminating the board, as shown in FIG. 3.

Figure 3:
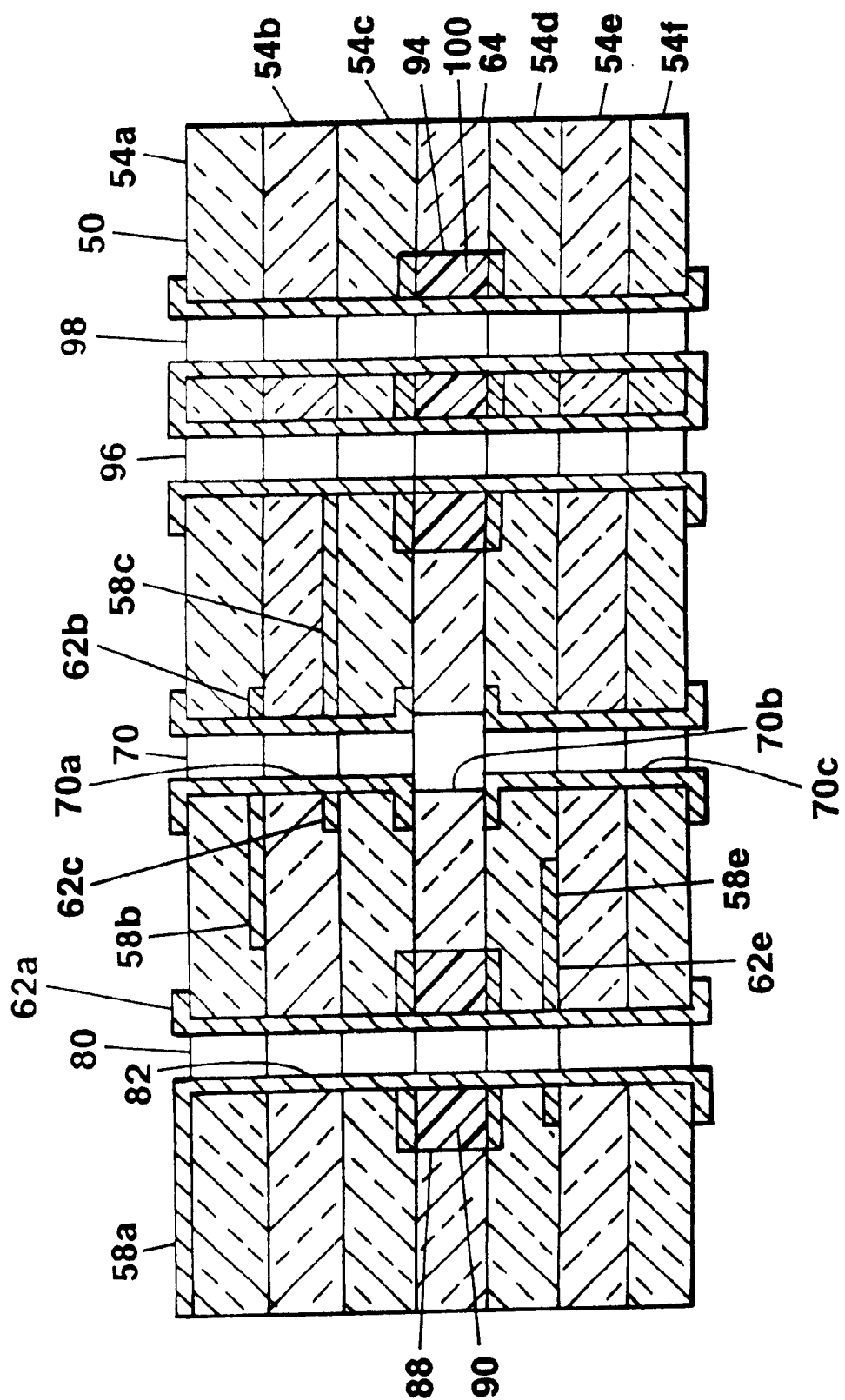
FIG. 3 is a cross-sectional view of a multi-layer printed circuit board having a non-platable layer, a discontinuous via, and a continuous via according to the invention.

Referring to FIG. 3, a multi-layer printed circuit board 50 includes a plurality of conventional dielectric layers 54a–54f and a non-platable layer 64, like layer 38 of FIG. 2, interleaved between dielectric layers 54c and 54d. The circuit board 50 includes a discontinuous via 70 formed as described above in connection with via 40 of FIG. 2. Thus, the discontinuous via 70 has an upper conductive portion 70a, a lower conductive portion 70c, and an electrically insulating intermediate portion 70b between the upper and lower portions. The upper conductive via portion 70a intersects a pad 62b of conductive trace 58b and a vertically aligned pad 62c of conductive trace 58c, thereby interconnecting traces 58b and 58c. The lower conductive via portion 70c extends through layers 54d, 54e, and 54f and can be used to interconnect conductive traces formed on layers 54d–54f. Further, although not shown, the conductive via portions 70a, 70c may be used to connect components mounted on the board to conductive traces formed on inner layers of the board which are located on the same side of the non-platable layer 64 as the respective via portions 70a, 70c. The intermediate insulating portion 70b of the via 70 extends through the non-platable layer 64 and provides a discontinuity in the conductive coating of the via.

One or more regions of the non-platable layer 64 are made platable at locations where it is desired to form a continuously conductive via through the board 50. More particularly, clearance holes 88 formed in the non-platable layer are provided with a platable inner surface to form a platable "plug" 90 or section, either by filling the hole with a platable material, such as epoxy resin, prior to drilling and plating the continuous via or by chemically conditioning the non-platable material to make it platable.

In the illustrative embodiment, a continuous via 80 is formed through a platable plug 90 in the non-platable layer 64. The continuous via 80 interconnects a conductive trace 58a on layer 54a which is disposed above the non-platable layer 64 with a conductive trace 58e on layer 54e which is below the non-platable layer by intersecting vertically aligned pads 62a, 62e of the respective traces, as shown.

In one embodiment, the platable plug 90 is formed prior to stacking and laminating the multi-layer board 50 by punching a clearance hole 88 through the layer 64 and inserting a platable material, such as epoxy resin, into the hole. Powdered epoxy is conventionally used for filling boards during PCB manufacture and such conventional material might be used in this application. An example of suitable material is Fiberite-Molding Compound. The material of the plug 90 is platable in the sense that the plating adheres to the material, by electroless or electrolytic deposition. The plug 90 may be inserted into the clearance hole 88 in the form of a powder or a disk stamped from conventional material that is press fit into place (i.e., held in place because it is compressed to fit in the hole, so no adhesive is needed). As an alternative, the platable plug 90 may be provided by chemically treating the non-platable walls of the clearance hole to make them platable.

It will be appreciated by those of ordinary skill in the art that the diameter of the clearance hole 88 can be varied, but must be at least larger than the via hole 82 so that the via walls do not intersect the non-platable layer 64. In the case of a plug formed by filling the hole 88 with a platable material, the plug 90 fills at least enough of the clearance hole 88 so that the hole 82 drilled to provide the via 80 intersects the plug 90 and preferably, the plug fills the entire clearance hole.

It will be appreciated by those of ordinary skill in the art that it may not be necessary to fill the clearance hole 88 with a platable material prior to lamination, since some epoxy resin from adjacent layers 54c, 54d generally will flow into the hole 88 during the lamination process. However, generally, it is preferable to fill the hole 88 with a platable material prior to lamination since otherwise conductive traces formed on the softened resin of the adjacent layers may move, causing the distance between traces to vary and requiring thicker prepreg layers than otherwise necessary in order to ensure vertical alignment of signal pads on different layers to be interconnected.

The layers 54a–54f and 64 of the board are stacked and laminated. The via 80 is formed by drilling a hole 82 through layers 54a–54f and through the platable plug 90 of layer 64. The hole 82 is then plated by a conventional process as described above in order to form the continuous via 80 through the board 50.

Clearance holes formed through the non-platable layer 64, like hole 88, may have various shapes and sizes. An oval clearance hole 94 is provided in the non-platable layer 64 in order to encompass two adjacent continuous vias 96, 98 carrying a differential pair of signals. The clearance hole 94 is filled with a platable material or chemically treated in order to form an oval platable plug 100, like plug 90, which is then drilled twice and plated to form adjacent vias 96, 98, as shown.

Figure 4:
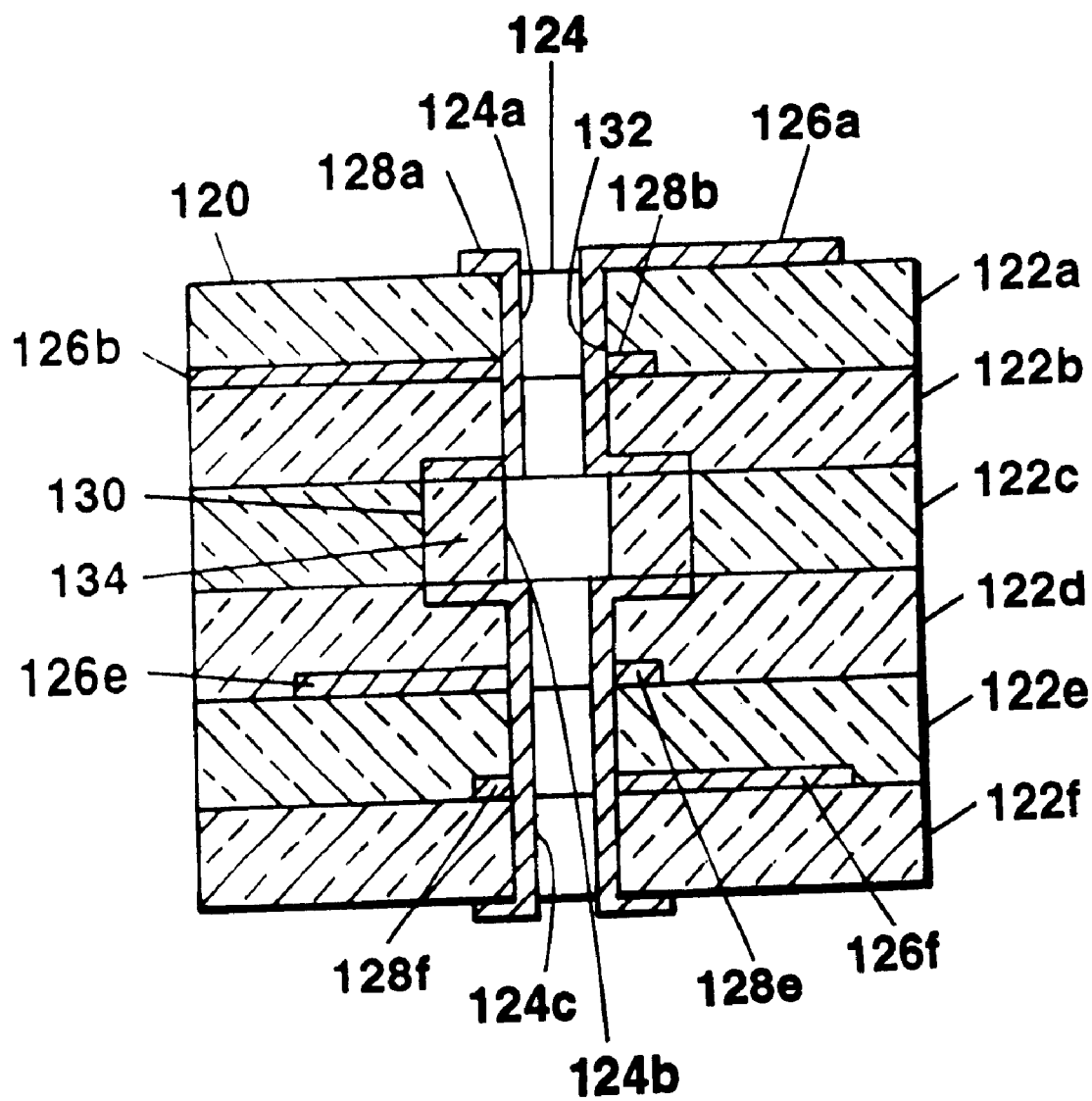
FIG. 4 is a cross-sectional view of a multi-layer printed circuit board having a layer with non-platable portions and a discontinuous via according to the invention.

Referring to FIG. 4, a multi-layer printed circuit board 120 includes a discontinuous via 124 having an upper conductive portion 124a, a lower conductive portion 124c, and an electrically insulating intermediate portion 124b between the upper and lower portions. The circuit board 120 differs from the circuit board 30 of FIG. 2 and from the circuit board 50 of FIG. 3 in that the insulating portion 124b of the via 124 extends through a conventional dielectric printed circuit board layer 122c, such as may be comprised of fiberglass-reinforced epoxy resin. A portion of the layer 122c where the discontinuous via 124 is located is made "non-platable" by forming a non-platable plug 134.

The circuit board 120 includes a plurality of dielectric layers 122a, 122b, 122c, 122d, 122e, and 122f on which conductive traces and pads are formed. Before the layers 122a–122f are stacked and laminated, a clearance hole 130 is punched through one or more of the layers where a discontinuous via is desired. In the illustrative embodiment, a clearance hole 130 is punched through layer 122c. The diameter of the clearance hole 130 is greater than the diameter of the hole 132 drilled to form the via 124 so that the via walls do not intersect the material of the layer 122c.

A non-platable material is inserted into the clearance hole 130 in order to form the non-platable plug 134. As one example, PTFE is inserted into the clearance hole 130. The non-platable material may take the form of a powder, liquid, or solid plug. For example, when printed circuit boards are manufactured, holes are punched into the laminates in precise alignment with the circuit traces and are then used for ensure proper registration of the stacked laminates. During the step of punching these registration holes, the clearance holes for the non-platable plugs may be punched. The sheets of laminate are then stacked up and the registration holes in the sheets go around posts in a frame. This step is mainly done by hand and could be disrupted to squeegee a non-platable powder or liquid across the surface in order to fill the clearance holes. Alternatively, the plugs can be provided by an oversized solid sheet of a non-platable material of the same thickness as the laminate which are held in place in the clearance holes by an interference fit. In this case, the plug may be inserted into the clearance hole as part of the registration hole punching operation. Or, you could do some combination of the two above-described processes can be used. For example, an undersized non-platable plug could be placed into the clearance hole and the area around the plug filled with a powder or liquid. Epoxy powder is the preferred for this purpose since it is already used in circuit board manufacture. Further, the plug could be copper clad, just like the laminate, as is particularly desirable if a pad is provided around the via.

Thereafter, the layers 122a–122f are laminated and a hole 132 which will form the discontinuous via 124 is drilled. Subsequent plating of the hole by conventional techniques, such as an electroless deposition of a thin layer of copper followed by an electrolytic deposition of a thicker copper layer, results in the discontinuous via 124 since the copper does not adhere to the plug 134. The upper conductive via portion 124a interconnects conductive traces 126a, 126b by intersecting vertically aligned pads 128a, 128b, the lower conductive via portion 124c interconnects conductive traces 126e, 126f by intersecting vertically aligned pads 128e, 128f, and the non-conductive via portion 124b electrically isolates the upper and lower conductive via portions 124a and 124c, respectively. Although not shown, the conductive via portions 124a, 124c may be used to connect components mounted on the board to conductive traces formed on inner layers of the board which are located on the same side of the non-platable plug 134 as the respective via portions 124a, 124c. Conventional conductive vias can be formed through the circuit board 120 in areas of the board other than where non-platable plugs 134 are formed.

Figure 5:
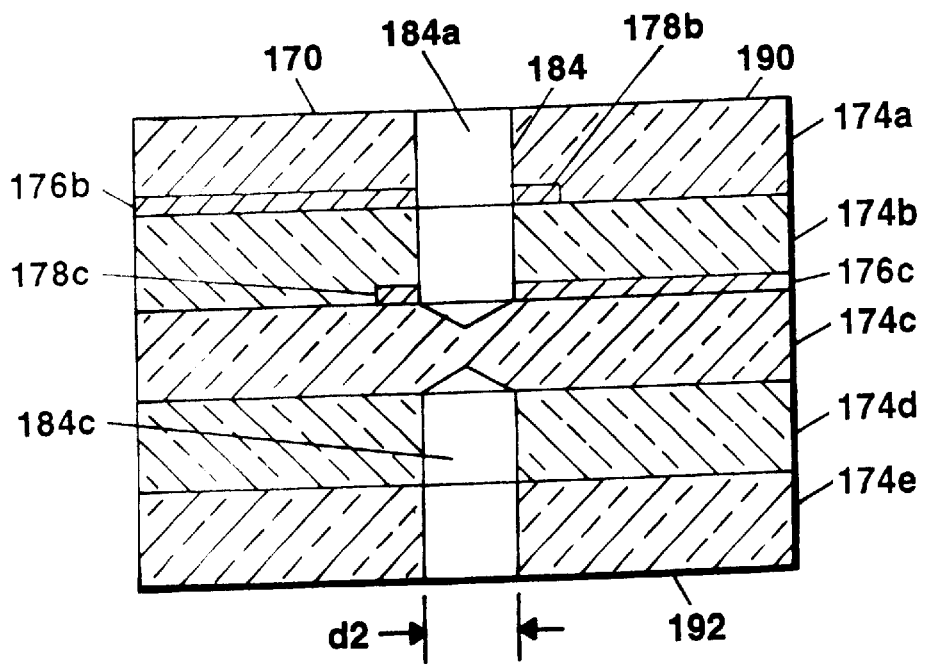
FIGS. 5–5C show cross-sectional views of a multi-layer printed circuit board having a discontinuous via with a narrow, electrically insulating intermediate portion according to the invention during different stages of fabrication.
Figure 5A:
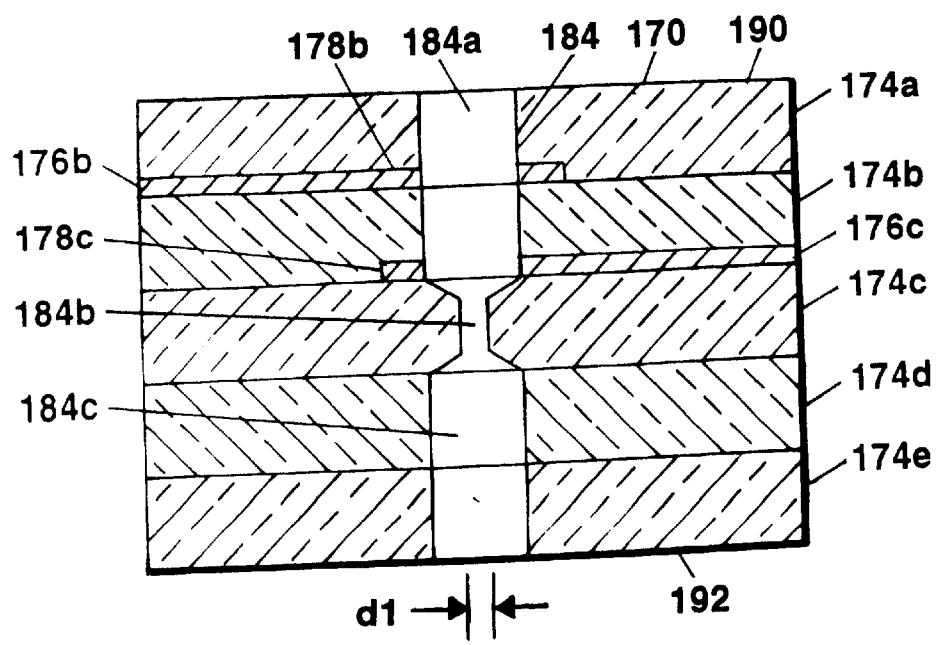
Figure 5B:
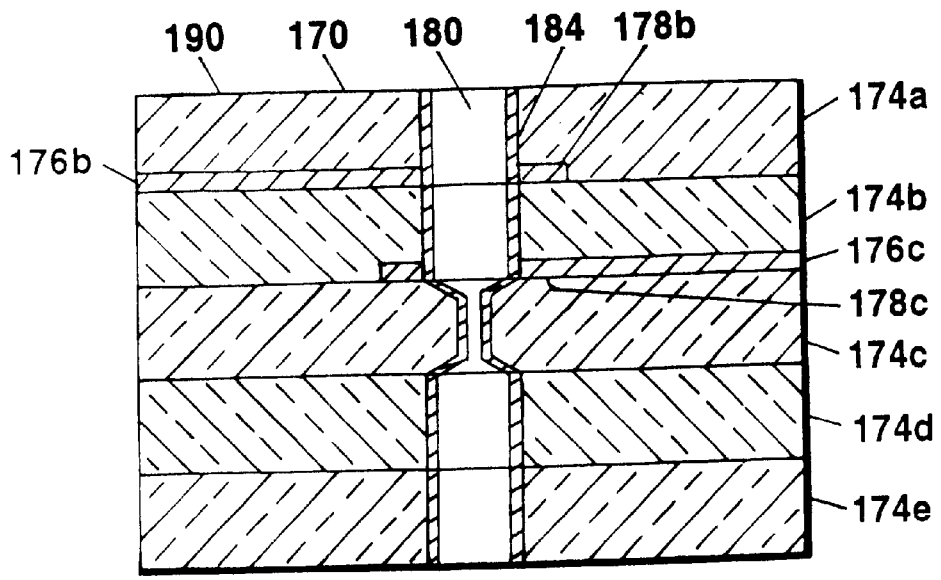
Figure 5C:
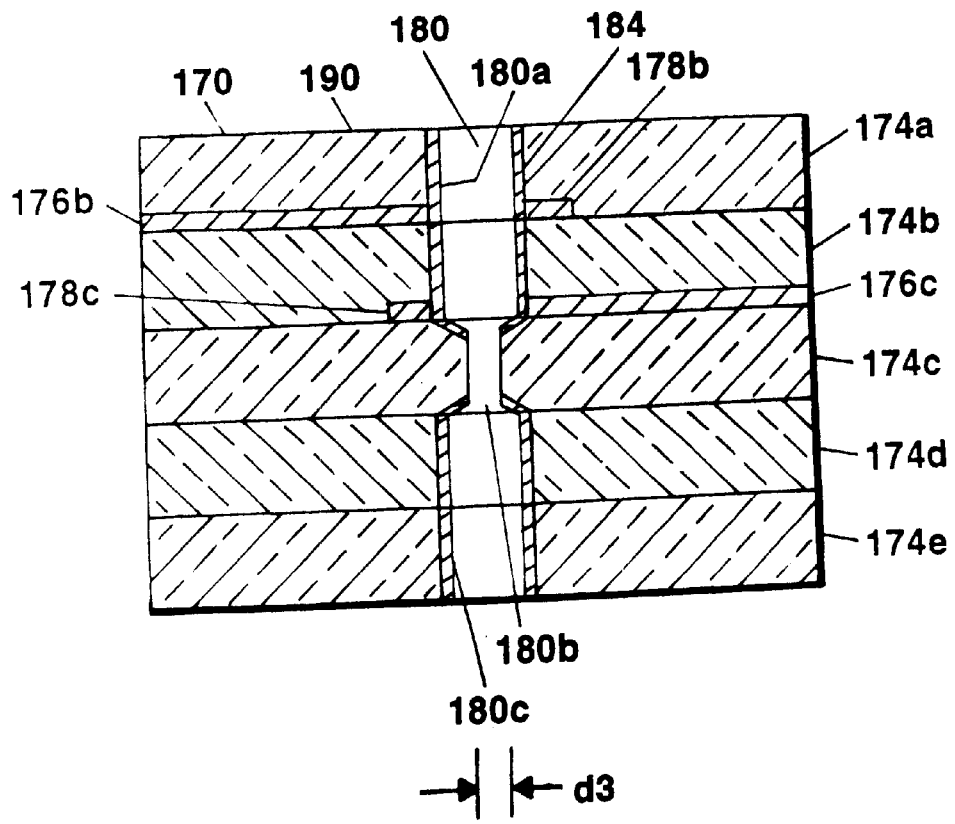

Referring to FIGS. 5–5C, an alternative technique is illustrated for forming a discontinuous via 180 (FIG. 5C) having an upper conductive portion 180a, a lower conductive portion 180c, and an intermediate non-conductive, electrically insulating portion 180b. The via 180 differs from the via 40 in FIG. 2, via 70 in FIG. 3, and via 124 of FIG. 4 in that the non-conductive via portion 180b has a narrower diameter than the conductive via portions 180a, 180c, as shown.

Referring to FIG. 5, the multi-layer printed circuit board 170 includes a plurality of stacked conventional dielectric layers 174a, 174b, 174c, 174d and 174e, as may be comprised of a fiberglass-reinforced epoxy resin. Each of the layers 174a–174e is processed using conventional photolithographic techniques to form a desired pattern of conductive traces and pads, such as conductive trace 176b and pad 178b on layer 174b and conductive trace 176c and pad 178c on layer 174c. The patterned layers 174a–174e are then stacked and laminated.

Vertically aligned holes 184a and 184c of relatively large diameter d2 are drilled from the upper surface 190 and lower surface 192 of the board. The holes 184a and 184c do not meet, but leave a land at some interior section of the board. The land is positioned to be at the layers where a discontinuity in the discontinuous via is desired.

Referring also to FIG. 5A, next, a hole 184b of a relatively small diameter d1 is then drilled though the land. The resulting hole 184 through the board 170 has an "hour glass" shape with relatively wide upper and lower portions 184a, 184c and a narrowed intermediate portion 184b, as shown.

The hole 184 may be tapered at the transition between the upper portion 184a and intermediate portion 184b and between the lower portion 184c and the intermediate portion 184b as is caused by the point of the drill bit. The taper can be used to position the narrow diameter hole 184b within holes 184a and 184c.

It will be appreciated by those of ordinary skill in the art that the order in which the holes 184a, 184b, and 184c are drilled may be modified. As one example, the large diameter hole 184a is drilled from the upper surface 190 of the board, following which the small diameter hole 184b is drilled from the same surface 190 of the board concentrically within the larger hole 184a. Next, the board is flipped and the large diameter hole 184c is drilled from the lower surface 192 of the board in vertical alignment with the hole 184a. With this arrangement, the board is flipped only once, thereby potentially increasing the positional accuracy of the small diameter hole 184b, since flipping the board requires repining the tooling plates.

In the illustrative embodiment, the diameter d1 of the narrowed portion 184b is on the order of 0.010–0.015 inches (0.25–0.38 mm) and the diameter d2 of the upper and lower portions 184a, 184c is on the order of 0.022–0.026 inches (0.56–0.66 mm). An illustrative diameter d3 is on the order of 0.016–0.021 inches (0.41–0.53 mm). It will be appreciated by those of ordinary skill in the art that the upper and lower hole portions 184a, 184c, respectively, may or may not have the same diameter as each other.

Referring also to FIG. 5B, the hole 184 is plated by a conventional process, as described above. In particular, an electroless plating process is used to apply a thin layer of copper to the walls of the holes 184 and the exposed areas on the surface 190 of the board. Thereafter, an electrolytic process is used to apply a thicker layer of copper and a layer of solder to the walls of the hole 184 and to the exposed areas on the surface 190 of the board. Finally, the resist, the copper under the resist, and the solder that was plated to protect the holes and circuits from the etching process are removed.

Referring to FIG. 5C, after the hole 184 is plated, the plated via is drilled with a drill bit having a diameter d3 which is larger than the diameter d1 and smaller than the diameter d2 in order to remove the plating on the walls of the narrow intermediate portion 180b of the via, but leave intact the plating on the upper and lower via portions 180a, 180c, respectively, as shown. With this arrangement, the upper conductive via portion 180a interconnects conductive traces 176b, 176c on layers 174b, 174c by intersecting vertically aligned pads 178b, 178c, as shown. Although not shown, the lower conductive via portion 180c may intersect pads to interconnect conductive traces on layers through which it extends and the conductive via portions 180a, 180c may be used to connect components mounted on the board to conductive traces formed on inner layers of the board which are located on the same side of insulating via portion 180b as the respective via portions 180a, 180c. And the intermediate electrically insulating portion 180b of the via isolates the upper portion 180a from the lower portion 180c.

The technique described in FIGS. 5–5C can be used to make a discontinuous via with upper and lower conducting segments that each interconnects traces at various levels. Alternatively, it can be used to make a hole that would be similar to a blind via, with only one conducting segment used for interconnecting traces. The technique, because it requires the plating of a through hole, allows better flow of plating solution into the hole than would result in the plating of a blind via. As a result, the plating is better than might be achieved with a conventional blind via.

It will be appreciated by those of ordinary skill in the art that various modifications to the structure and technique described in connection with FIGS. 5–5C are possible while still providing the desired discontinuous via of the invention. For example, the reduced diameter portion 180b of the via 180 need not be centered in the height of the circuit board 170 and may span more than one layer and portions of a layer.

Figure 6:
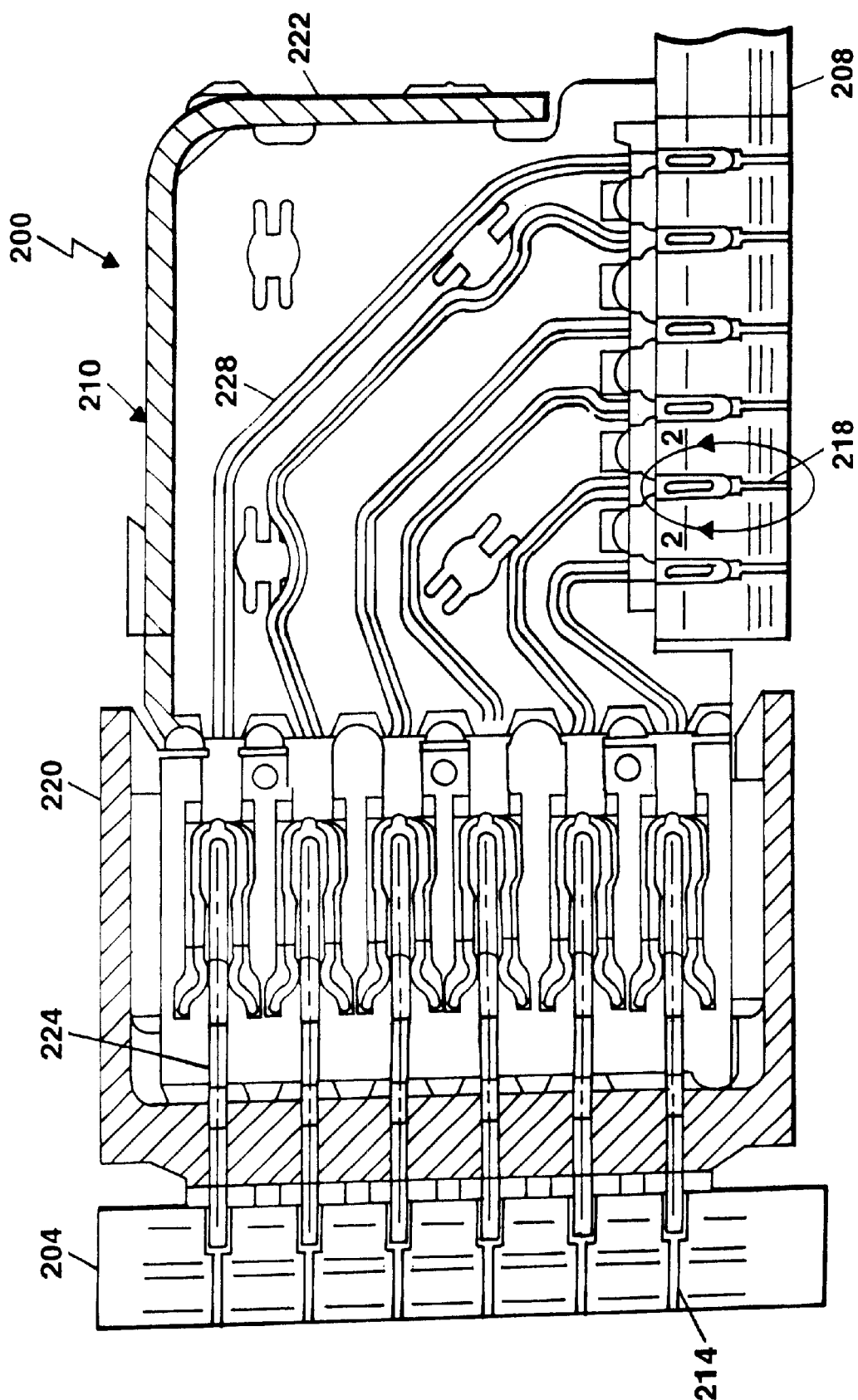
FIG. 6 shows a backplane assembly including at least one multi-layer printed circuit board having a discontinuous via according to the invention.

Referring to FIG. 6, a backplane assembly 200 includes a backplane 204, a daughter card 208, and a connector assembly 210 for interconnecting signal traces on the backplane and daughter card. The backplane 204 and/or the daughter card 208 are provided with one or more discontinuous vias 214, 218, respectively, as shown. The discontinuous vias 214, 218 may take the form of any of the discontinuous vias described above in conjunction with FIGS. 1–5C. For example, the discontinuous vias 214, 218 may take the form of via 40 of FIG. 2, via 70 of FIG. 3, via 124 of FIG. 4 or via 180 of FIGS. 5–5C.

The connector assembly 210 includes a pair of electrical connectors 220, 222, each having an insulative housing supporting a plurality of signal contacts 224, 228, respectively, adapted for mating in a conventional manner, as shown. It will be appreciated by those of ordinary skill in the art that the connector assembly 210 is illustrative of various types of conventional connectors used to interconnect daughter cards to a backplane. Another electrical connector suitable for use in the backplane assembly 200 is shown in U.S. Pat. No. 5,980,321 to Cohen et al., entitled HIGH SPEED, HIGH DENSITY ELECTRICAL CONNECTOR.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims. It should, for example, be appreciated that the number of layers in a printed circuit board is given for illustration and is not a limitation on the invention.

Also, it is described that a discontinuous via has two conducting and one non-conducting section, with the conducting sections adjacent to the surfaces of the board. This arrangement is shown for illustration of the preferred embodiment because it presents the easiest way to make electrical contact to the board for electrolytic deposition on the via segments. For example, a series of blind vias might be formed on the surface of the board, with the length of the conducting coating on each via being controlled by a non-platable layer. In this way, the length of the conducting coating would be independent of the depth to which the hole was drilled.

Further, it is not necessary that the non-platable material occupy a single layer in the PCB. The non-platable material could be an arbitrary thickness and could extend from the conducting segment to the surface of the printed circuit board, resulting on only one conducting segment.

Further, it is not necessary that the conducting segments be adjacent the surface of the printed circuit board. The non-platable material might be positioned above and below an interior region of the board, similar to a blind via. To finish such a structure, an alternative way to make electrical connection to the conducting segment of the via for electrolytic deposition would be required. Or, the central portions would have to be coated using a process other than electrolytic deposition.

Also, it was described that plugs could be inserted into spacer layers to create layers that are partially non-platable. However, a similar finished structure could be achieved by pasting a plug on the lower surface of the laminate which represents the bottom of the upper conducting segment or the top surface of the laminate that represents the top of the lower conducting segment. Or, the plug could be pasted to the spacer without necessarily punching a hole in the spacer.

Further, it should be appreciated that the term "plug" is used to describe sections of material. The plug need not be solid. It could be powdered or liquid or in other suitable form. Further, the "plug" could be created by doping or otherwise chemically treating a region of laminate. For example, PTFE powder might be pressed into a conventional epoxy-fiberglass spacer. Or, epoxy powder or a conducting powder might be pressed into an otherwise non-platable layer. Or, chemical treatment, of the type normally used to activate PTFE where it is desired to coat it with electroless deposition, could be applied to those holes where it is desired to not form a discontinuous via. Those vias where a discontinuous via is desired would need to be masked during the activation step.

Preferably, a board to contain holes with continuous and discontinuous via holes can be formed with one or more sheets of non-platable material as described above. The holes that are to be formed as plated through vias are drilled first. Then the board is subjected to a chemical conditioning operation that activates the non-platable material exposed by drilling the hole. A known chemical conditioning step could be used. For example, PTFE is sometimes included in circuit boards now because of its desirable dielectric properties. To use PTFE now, a plasma treatment operation is used to ensure adhesion to the PTFE. Then, holes that are to be formed as discontinuous vias are drilled. The interiors of these holes are not treated to enhance adhesion. Thus, when the electroless deposition occurs, it will fully plate the inside of the chemically activated holes, but will be discontinuous in the untreated holes.

As an example of another variation, it is noted that in conjunction with FIGS. 5–5C, it is described that holes 184a and 184c are drilled first and then a hole 184b is drilled. This order is preferred for thick boards where it might be difficult to accurately drill a small diameter hole. However, hole 184b could be drilled first and the same structure would result.

Further, it should be noted that all the examples of the invention have discontinuities in the vias running parallel to the surface of the printed circuit board. The discontinuities could be made to run along the length of the via to create a structure such as shown in U.S. Pat. No. 6,137,064 to Kiani, et al. SPLIT VIA SURFACE MOUNT CONNECTOR AND RELATED TECHNIQUES. Such a structure might be formed by drilling a hole, slicing grooves into the sides of the holes. The hole, including the grooves, could then be filled with non-platable material. The hole could then be drilled out with a diameter that was equal to or slightly larger than the diameter of the original hole, but still small than the diameter of the hole as measured to the bottom of the grooves. The hole would then have stripes of non-platable material separating stripes of platable material.

As a further variation, it should be appreciated that traditional printed circuit board materials are described as the preferred embodiment because processing of such materials is well known and processing chemicals and equipment are readily available. It should be appreciated that other materials might be used. For example, other metals might be substituted for copper.

All publications and references cited herein are expressly incorporated herein by reference in their entirety.

What is claimed is:

1. A printed circuit board comprising:
   a plurality of stacked dielectric layers; and
   a via extending through said stacked dielectric layers, said via having an upper portion with electrically conductive walls, a lower portion with electrically conductive walls, and an intermediate portion with electrically insulating walls, said intermediate portion disposed between said upper portion and said lower portion.

2. The printed circuit board of claim 1 wherein at least one of said plurality of dielectric layers has at least one non-platable region and wherein said intermediate portion of said via extends through said at least one non-platable region of said dielectric layer.

3. The printed circuit board of claim 2 wherein said at least one dielectric layer and said non-platable region of said at least one dielectric layer comprise PTFE.

4. The printed circuit board of claim 3 wherein said at least one dielectric layer has a chemically treated, platable region.

5. The printed circuit board of claim 2 wherein said at least one dielectric layer comprises epoxy resin and said non-platable region of said at least one dielectric layer comprises PTFE.

6. The printed circuit board of claim 1 wherein said intermediate portion of said via has a smaller diameter than said upper portion and said lower portion.

7. A printed circuit board comprising:
   a first plurality of dielectric layers;
   a second plurality of dielectric layers disposed over said first plurality of dielectric layers;
   a dielectric layer comprised of a non-platable material disposed between said first plurality of dielectric layers and said second plurality of dielectric layers; and
   a via extending through said first plurality of dielectric layers, said non-platable dielectric layer and said second plurality of dielectric layers, wherein a first portion of said via extending through said first plurality of dielectric layers has conductive walls, a second portion of said via extending through said second plurality of dielectric layers has conductive walls, and a third portion of said via extending through said non-platable dielectric layer has non-conductive walls.

8. The printed circuit board of claim 7 wherein said non-platable material is comprised of PTFE.

9. The printed circuit board of claim 8 wherein said non-platable material further comprises at least one of glass fibers and ceramic fibers.

10. The printed circuit board of claim 7 wherein a portion of said non-platable dielectric layer is platable and wherein said printed circuit board further comprises a second via extending through said first plurality of dielectric layers, said platable portion of said non-platable dielectric layer, and said second plurality of dielectric layers, and wherein said second via has continuously conductive walls.

11. The printed circuit board of claim 10 wherein said platable portion of said non-platable dielectric layer is chemically treated.

12. The printed circuit board of claim 10 wherein said platable portion of said non-platable dielectric layer comprises a platable material inserted into a clearance hole through said non-platable dielectric layer.

* * * * *

UNITED STATES PATENT AND TRADEMARK OFFICE
CERTIFICATE OF CORRECTION

PATENT NO. : 6,541,712 B1
DATED : April 1, 2003
INVENTOR(S) : Ellen M. Gately et al.

It is certified that error appears in the above-identified patent and that said Letters Patent is hereby corrected as shown below:

Column 2,
Line 51, reads "additional is" and should read -- additional --.

Column 3,
Line 41, reads "can formed" and should read -- can be formed --.

Column 4,
Line 24, reads "34d, and 34e," and should read -- 34d, 34e, --.

Column 5,
Line 65, reads "materially" should read -- material --.

Column 9,
Line 26, reads "for ensure" should read -- to ensure --.
Line 38, reads "Or, you could do some" should read -- Or, some --.

Column 10,
Line 28, reads ""hour glass"" should read -- "hourglass" --.

Column 13,
Line 19, reads "hole, slicing" should read -- hole and slicing --.
Line 20, reads "the holes" should read -- the hole --.
Line 23, reads "small" should read -- smaller --.

Signed and Sealed this

Thirtieth Day of December, 2003

JAMES E. ROGAN
*Director of the United States Patent and Trademark Office*